(12) United States Patent
Indyk et al.

(10) Patent No.: US 10,134,577 B2
(45) Date of Patent: Nov. 20, 2018

(54) EDGE TRIM PROCESSES AND RESULTANT STRUCTURES

(71) Applicant: INTERNATIONAL BUSINESS MACHINES CORPORATION, Armonk, NY (US)

(72) Inventors: Richard F. Indyk, Wappingers Falls, NY (US); Deepika Priyadarshini, Guilderland, NY (US); Spyridon Skordas, Wappingers Falls, NY (US); Edmund J. Sprogis, Williston, VT (US); Anthony K. Stamper, Williston, VT (US); Kevin R. Winstel, East Greenbush, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 223 days.

(21) Appl. No.: 14/718,747

(22) Filed: May 21, 2015

(65) Prior Publication Data

US 2016/0343564 A1    Nov. 24, 2016

(51) Int. Cl.
| | | |
|---|---|---|
| *H01L 21/02* | (2006.01) | |
| *B32B 3/02* | (2006.01) | |
| *B32B 3/30* | (2006.01) | |
| *B32B 7/12* | (2006.01) | |

(52) U.S. Cl.
CPC .......... *H01L 21/02035* (2013.01); *B32B 3/02* (2013.01); *B32B 3/30* (2013.01); *B32B 7/12* (2013.01); *H01L 21/02013* (2013.01); *H01L 21/02021* (2013.01); *B32B 2250/02* (2013.01); *B32B 2457/14* (2013.01)

(58) Field of Classification Search
CPC ............... B24B 9/065; H01L 21/02035; H01L 21/02013; H01L 21/02021; H01L 21/6835
USPC .................................. 451/57, 58, 44, 43, 63
See application file for complete search history.

(56) References Cited

U.S. PATENT DOCUMENTS

| | | | | |
|---|---|---|---|---|
| 5,152,857 A | * | 10/1992 | Ito ....................... | H01L 21/2007 257/E21.237 |
| 7,129,172 B2 | * | 10/2006 | Morrow ................ | H01L 21/187 257/E21.088 |
| 7,682,224 B2 | * | 3/2010 | Kimura .................. | B24B 37/04 257/E21.237 |
| 2004/0198196 A1 | * | 10/2004 | Walsh ..................... | B24B 49/16 451/58 |
| 2009/0095399 A1 | * | 4/2009 | Zussy ............... | H01L 21/76251 156/60 |

* cited by examiner

*Primary Examiner* — Robert Rose
(74) *Attorney, Agent, or Firm* — Anthony Canale; Andrew M. Calderon; Roberts Mlotkowski Safran Cole & Calderon, P.C.

(57) ABSTRACT

Edge trim processes in 3D integrated circuits and resultant structures are provided. The method includes trimming an edge of a wafer at an angle to form a sloped sidewall. The method further includes attaching the wafer to a carrier wafer with a smaller diameter lower portion of the wafer bonded to the carrier wafer. The method further includes thinning the wafer while it is attached to the wafer.

17 Claims, 4 Drawing Sheets

EDGE TRIM PROCESSES AND RESULTANT STRUCTURES

FIELD OF THE INVENTION

The invention relates to semiconductor structures and, more particularly, to edge trim processes in 3D integrated circuits and resultant structures.

BACKGROUND

In microelectronics, a three dimensional (3D) integrated circuit is manufactured by stacking silicon wafers and/or dies and interconnecting them vertically so that they behave as a single device to achieve performance improvements at reduced power and smaller footprint than conventional two dimensional structures. The manufacture of 3D integrated circuits involves bonding and thinning of top and intermediate wafers; however, wafer-wafer bonding is a challenge and the industry is rigorously working to find efficient, reliable bonding solutions.

Although significant advancements have been made in wafer-wafer bonding technology, bonding at the wafer edge is still a concern. And, as the wafer size increases from 300 mm to 450 mm, bonding at the wafer edge becomes an even bigger problem.

Wafer-wafer bonding requires edge trimming processes. Edge trimming the weak edge bonded regions removes the weakly bonded region and avoids particle contamination in downside processing. Edge trimming requires trimming only the top wafer of the bonded pair however, stopping the trim process exactly at the bonding interface is a challenge due to many factors. These factors include, e.g., low tolerance of the existing edge trim tool which is approximately +/−15-20 μm; shallow edge trim leaves the top wafer and can cause foreign material (FM) and deeper edge trim can result in the bottom wafer being thinned too much and hence having greater chances of chipping or breaking.

SUMMARY

In an aspect of the invention, a method comprises trimming an edge of a wafer at an angle to form a sloped sidewall. The method further comprises attaching the wafer to a carrier wafer with a smaller diameter lower portion of the wafer bonded to the carrier wafer. The method further comprises thinning the wafer while it is attached to the carrier wafer.

In an aspect of the invention, a method comprises forming a beveled edge with a top surface having a larger diameter than a diameter of a bottom surface. The method further comprises bonding the bottom surface of the wafer to a carrier wafer. The method further comprises grinding the wafer to a predetermined thickness while it remains bonded to the carrier wafer.

In an aspect of the invention, a structure comprises: a non-edge trimmed carrier wafer; and a wafer with a beveled edge about a diameter bonded to the non-edge trimmed carrier wafer, wherein a surface which is bonded to the non-edge trimmed carrier wafer is smaller than an original diameter of the wafer, in a non-edge trimmed state.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to edge trim processes in 3D integrated circuits and resultant structures. Advantageously, the processes described herein prevent chipping of the wafers during bonding and thinning processes and leads to increased yields in 3D technologies.

In embodiments, the edge trimming processes are independent of the tolerance of the edge trim station, e.g., edge trimming tool. In this way, it is possible to provide accurate edge trimming processes regardless of the low tolerances of the existing edge trim tool (e.g., approximately +/−15-20 μm). Moreover, the edge trimming processes avoid wafer chipping and cracking due to too deep edge trim where the bottom wafer becomes too thin at the edge and easily breaks during grinding or other process steps. In addition, the edge trimming processes overcome shallow edge trimming in case of very conservative targets and are independent of the edge trim repeatability, tool/process stability. And, unlike conventional trimming processes, the edge trimming processes described herein do not leave thin Si at the edge without support. Accordingly, by implementing the edge trimming processes described herein tremendous increase in yield can be achieved.

Figure 1A:
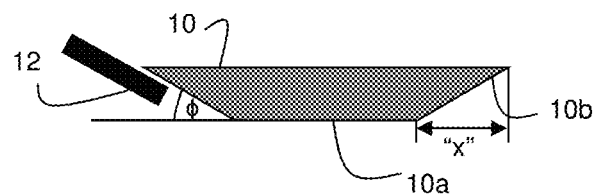
FIG. 1a shows a process of edge trimming of a wafer and respective structures in accordance with aspects of the present invention.

FIGS. 1a-1d show processes of edge trimming of a wafer and respective structures in accordance with aspects of the present invention. More specifically, FIG. 1a shows a wafer 10 trimmed at an angle φ using a trim tool 12, positioned at a corresponding angle. The trim tool 12 can be, for example, a dicing blade. In embodiments, the wafer 10 can be composed of any suitable material including, but not limited to, Si, SiGe, SiGeC, SiC, GE alloys, GaAs, InAs, InP, and other III/V or II/VI compound semiconductors. The wafer 10 can also be silicon on insulator (SOI) or bulk wafer. The thickness of the wafer 10 is approximately 750 microns; although other dimensions are also contemplated by the present invention.

In embodiments, the trimmed angle φ will result in a beveled edge about the wafer, which can vary based on chip coverage and/or other design characteristics. For example, the trimmed angle φ can be an angle greater than 0° and less than 90° and more preferably approximately 10° to 80° (e.g., resulting in a non-straight edge). In further embodiments, the edge trimming process will remove approximately 0.5-5 mm (as represented by "x") from about a bottom portion 10a of the wafer 10. The trimmed angle φ (resulting in removal of portions of the bottom surface) accordingly results in a beveled edge or sloped sidewall 10b, with a diameter of the bottom surface 10a of the wafer 10 being smaller than a diameter of an upper surface of the wafer 10. It should be recognized by those of skill in the art that other dimensions are also contemplated by the present invention, noting that the diameter of the bottom surface 10a should remain smaller than an upper surface thereby ensuring that the top surface remains supported during subsequent grinding processes.

Due to the angled cut, a top surface of the wafer 10 (which is being ground) will always be supported by the beveled edge or sloped sidewall 10b during the thinning or grinding process. In this way, the processes described herein will prevent cracking or chipping of the wafer 10, itself, due to the support provided by each successive portion of the beveled edge or sloped sidewall 10b during grinding processes. Also, as the wafer 10 is cut prior to the bonding process, the processes described herein avoid thinning of a bottom carrier wafer, as well as preventing any trim in the edge of the bottom carrier wafer. Moreover, the edge trimming process described herein is independent of any tolerances of the edge trimming tool.

Figure 1B:
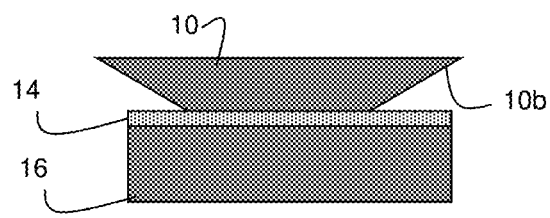
FIG. 1b shows a process of bonding the edge trimmed wafer to a substrate and respective structures in accordance with aspects of the present invention.

In FIG. 1b, the bottom surface 10a of the wafer 10 is bonded to a carrier wafer 16 as shown at interface 14. In embodiments, the interface can be representative of a bonding material 14 such as a thermal adhesive bonding, e.g., polymer material known to those of skill in the art. In alternative processes, the bonding can be Si—Si bonding, a plasma activation bonding, or oxide-to-oxide bonding or Cu—Cu thermo compression bonding as illustrative non-limiting examples. The carrier wafer 16 can be composed of any suitable material including, but not limited to, Si, SiGe, SiGeC, SiC, GE alloys, GaAs, InAs, InP, and other III/V or II/VI compound semiconductors.

Figure 1C:
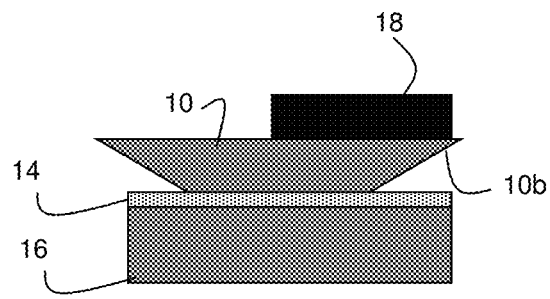
FIG. 1c shows a process of thinning the edge trimmed wafer and respective structures in accordance with aspects of the present invention.
Figure 1D:
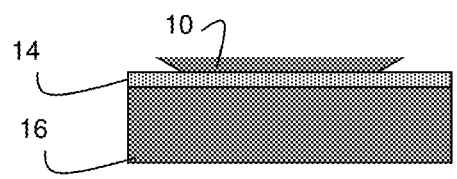
FIG. 1d shows a final thickness of the trimmed wafer in accordance with aspects of the present invention.

In FIG. 1c, the wafer 10 is thinned using a grind wheel 18, for example. In embodiments, the grinding begins on a top surface of the wafer 10 and works its way through a portion of the beveled edge or sloped sidewall 10b, which completely supports the top surface from an underside during the grinding process. FIG. 1d shows a final thickness of the wafer 10, after the grinding process is completed.

Figure 2A:
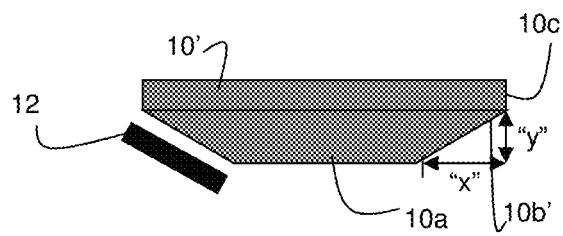
FIG. 2a shows a process of edge trimming of a wafer and respective structures in accordance with aspects of the present invention.

FIGS. 2a-2d show processes of edge trimming of a wafer and respective structures in accordance with alternative aspects of the present invention. More specifically, FIG. 2a shows a wafer 10' trimmed at an angle φ using a trim tool 12, e.g., dicing blade, positioned at a corresponding angle. As in each of the embodiments, the wafer 10 can be composed of any suitable material including, but not limited to, Si, SiGe, SiGeC, SiC, GE alloys, GaAs, InAs, InP, and other III/V or II/VI compound semiconductors. The wafer 10' can also be silicon on insulator (SOI) or bulk wafer. The thickness of the wafer 10 is approximately 750 microns; although other dimensions are also contemplated by the present invention.

In embodiments shown in FIG. 2a, the trim tool 12 cuts the wafer 10 at an angle partially through a height "y" of the wafer 10'. This results in a beveled edge or sloped sidewall 10b' extending from a bottom surface 10a to a straight edge or non-trimmed portion 10c of the wafer 10'. In this embodiment, the straight edge or non-trimmed portion 10c of the wafer 10' is above the beveled edge or sloped sidewall 10b', e.g., forms a portion of the top of the wafer 10'. In embodiments, the thickness of the non-trimmed portion 10c and the trimmed angle φ (e.g., beveled edge about the wafer), can vary, depending on the particular angle of the trim tool 12. For example, depending on chip coverage and/or other design characteristics, the trimmed angle φ can be an angle greater than 0° and less than 90° and more preferably approximately 10° to 80° (e.g., resulting in a non-straight edge). In embodiments, the height of the non-trimmed portion, e.g., straight edge 10c, should not exceed a thickness of the final wafer thickness. This ensures that the sloped sidewall 10b' will support upper surfaces during the grinding process.

In further embodiments, the edge trimming process will remove approximately 0.5-5 mm (as represented by "x") from an edge of the wafer 10', as measured on a bottom surface 10a of the wafer. The trimmed angle φ (resulting in removal of portions of the bottom surface) results in a sloped sidewall 10b', with a diameter of the bottom surface 10a being smaller than a diameter of an upper surface as already described herein.

Accordingly, and as previously described, the top surface of the wafer 10' will always be supported during the thinning or grinding process by a lower portion of the wafer, as represented by the beveled edge or sloped sidewall 10b'. In this way, the processes described herein will prevent cracking or chipping of the wafer 10' during grinding processes. Also, as the wafer 10' is cut prior to the bonding process, the processes described herein avoid thinning of a bottom carrier wafer, as well as prevents any trim in the edge of the bottom carrier wafer. Moreover, the edge trimming process described herein is independent of any tolerances of the edge trimming tool.

Figure 2B:
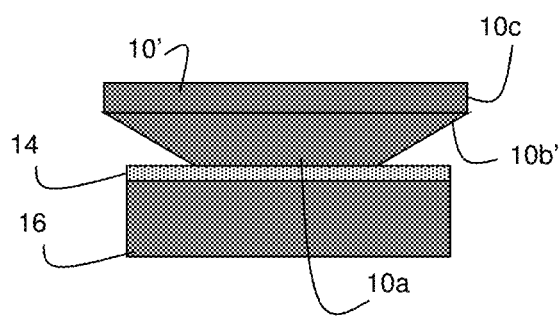
FIG. 2b shows a process of bonding the edge trimmed wafer to a substrate and respective structures in accordance with aspects of the present invention.

In FIG. 2b, the bottom surface 10a of the wafer 10' is bonded to a carrier wafer 16 as shown at interface 14. In embodiments, the interface can be representative of a bonding material 14 such as a thermal adhesive bonding, e.g., polymer material known to those of skill in the art. In alternative processes, the bonding can be Si—Si bonding, a plasma activation bonding, or oxide-to-oxide bonding. The carrier wafer 16 can be composed of any suitable material including, but not limited to, Si, SiGe, SiGeC, SiC, GE alloys, GaAs, InAs, InP, and other III/V or II/VI compound semiconductors.

Figure 2C:
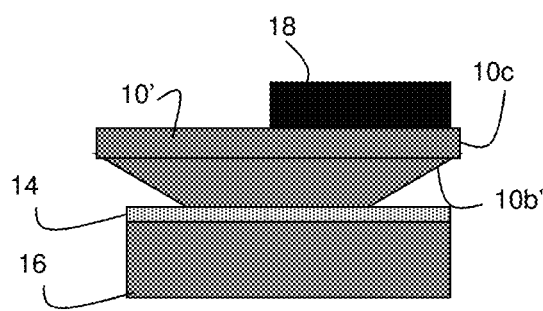
FIG. 2c shows a process of thinning the edge trimmed wafer and respective structures in accordance with aspects of the present invention.
Figure 2D:
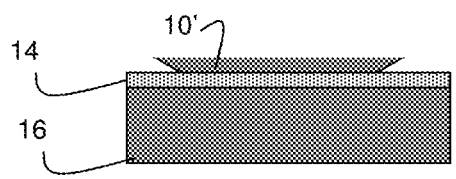
FIG. 2d shows a final thickness of the trimmed wafer in accordance with aspects of the present invention.

In FIG. 2c, the wafer 10' is thinned using a grind wheel 18, for example. In embodiments, the grinding begins on a top surface of the wafer 10' and works its way through the untrimmed portions 10c and partially through the sloped sidewall 10b', which supports the top surface from an underside during the grinding process. FIG. 2d shows a final thickness of the wafer 10', after the grinding process is completed.

Figure 3A:
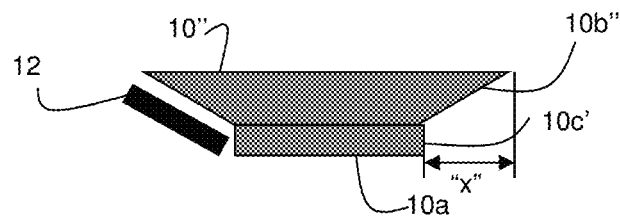
FIG. 3a shows a process of edge trimming of a wafer and respective structures in accordance with aspects of the present invention.

FIGS. 3a-3d show alternative processes of edge trimming of a wafer and respective structures in accordance with aspects of the present invention. More specifically, FIG. 3a shows a wafer 10" trimmed at an angle φ using a trim tool 12, e.g., a dicing blade positioned at a corresponding angle. The thickness of the wafer 10 is approximately 750 microns; although other dimensions are also contemplated by the present invention.

In embodiments shown in FIG. 3a, the trim tool 12 cuts the wafer 10" at an angle from a top portion of the wafer 10", with a subsequent straight cut forming a pedestal 10c'. Accordingly, the trimming process results in a beveled edge or sloped sidewall 10b" about the wafer, extending from a top surface of the wafer 10" to a straight edge or non-trimmed portion (e.g., pedestal 10c') of the wafer 10". In this embodiment, the edge trimming process will remove approximately 0.5-5 mm (as represented by "x") from an edge of the wafer 10", as measured on a bottom surface 10a. Accordingly, the pedestal 10c' will have a diameter that is smaller than a diameter of the upper surface.

In embodiments, the trimmed angle φ can vary, depending on the particular angle of the trim tool 12. For example, depending on chip coverage and/or other design characteristics, the trimmed angle φ can be an angle greater than 0° and less than 90° and more preferably approximately 10° to 80° (e.g., resulting in a non-straight edge). Also, the height of the pedestal 10c' can vary depending on chip coverage and/or other design characteristics, e.g., have a height of approximately 15 to 50 µm. In embodiments, the height of the pedestal 10c' could include material that is to be removed during the grinding or thinning process.

Accordingly, and as previously described, the top surface of the wafer 10" will always be supported during the thinning or grinding process by a lower portion of the wafer, as represented by the beveled edge or sloped sidewall 10b'. In this way, the processes described herein will prevent cracking or chipping of the wafer 10' during grinding processes. Also, as the wafer 10" is cut prior to the bonding process, the processes described herein avoid thinning of a bottom carrier wafer, as well as prevents any trim in the edge of the bottom carrier wafer. Moreover, the edge trimming process described herein is independent of any tolerances of the edge trimming tool.

Figure 3B:
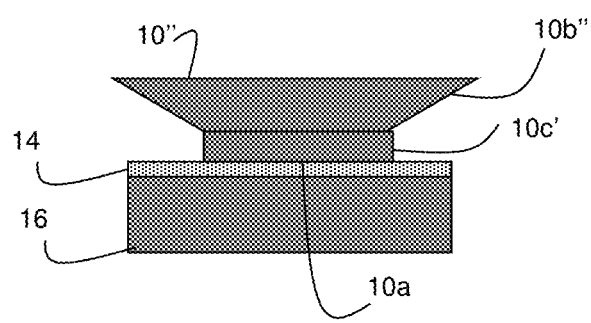
FIG. 3b shows a process of bonding the edge trimmed wafer to a substrate and respective structures in accordance with aspects of the present invention.

In FIG. 3b, the bottom surface 10a of the pedestal 10c' is bonded to a carrier wafer 16 as shown at interface 14. In embodiments, the interface can be a bonding material 14 such as a thermal adhesive bonding, e.g., polymer material known to those of skill in the art. In alternative processes, the bonding can be Si—Si bonding, a plasma activation bonding, or oxide-to-oxide bonding. The carrier wafer 16 can be composed of any suitable material including, but not limited to, Si, SiGe, SiGeC, SiC, GE alloys, GaAs, InAs, InP, and other III/V or II/VI compound semiconductors.

Figure 3C:
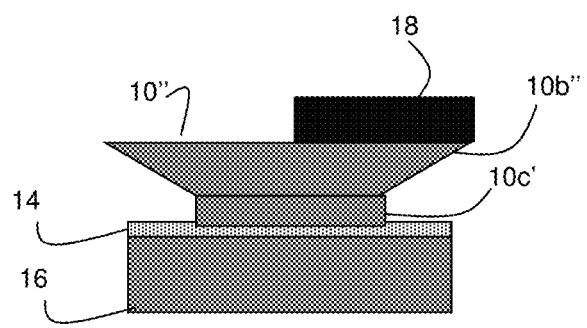
FIG. 3c shows a process of thinning the edge trimmed wafer and respective structures in accordance with aspects of the present invention.
Figure 3D:
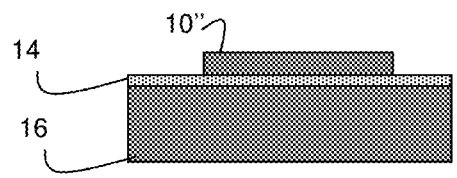
FIG. 3d shows a final thickness of the trimmed wafer in accordance with aspects of the present invention.

In FIG. 3c, the wafer 10" is thinned using a grind wheel 18, for example. In embodiments, the grinding begins on a top surface of the wafer 10 and works its way through the pedestal 10c'. FIG. 3d shows a final thickness of the wafer 10', after the grinding process is completed.

In each of the embodiments shown in FIGS. 1a-3d, the carrier wafer 16 is not trimmed or cut; that is, the carrier wafer 16 has a full thickness about its edges. This is due to the fact that the wafer 10, 10' and 10" is bonded to the carrier wafer only after the trimming process. In this way, the carrier wafer 16 will not be trimmed, and tolerances of the trim tool 12 do not need to be taken into consideration. In addition, in each of the embodiments shown in FIGS. 1a-3d, the wafer 10, 10' and 10" has trimmed edges to the extent shown in each of the different embodiments. Moreover, in each of the embodiments shown in FIGS. 1a-3d, a smaller diameter surface of the wafer 10, 10' and 10" is mounted to the carrier wafer 16, compared to its original diameter, prior to the grinding and trimming processes.

Figure 4A:
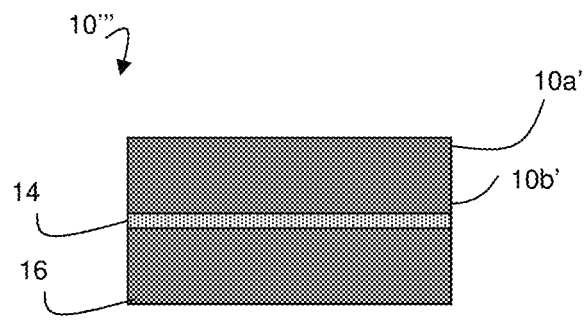
FIG. 4a shows a process of bonding a wafer to a substrate and respective structures in accordance with aspects of the present invention.

FIGS. 4a-4d show alternative processes of edge trimming of a wafer and respective structures in accordance with aspects of the present invention. More specifically, FIG. 4a shows a bonded wafer structure 10''' with wafer 10a' bonded to a carrier wafer 16. The interface 14 between the wafer 10a' and the carrier wafer 16 may be representative of a bonding material or method thereof as described already. The wafer 10a' and the carrier wafer 16 can be composed of any suitable material including, but not limited to, Si, SiGe, SiGeC, SiC, GE alloys, GaAs, InAs, InP, and other III/V or II/VI compound semiconductors.

Figure 4B:
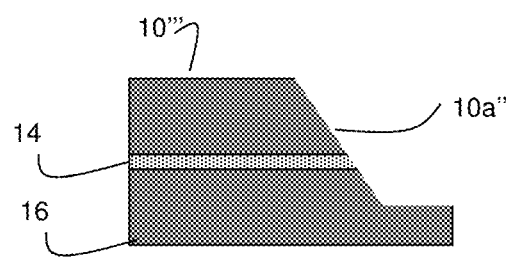
FIG. 4b shows a process of edge trimming the wafer and substrate and respective structures in accordance with aspects of the present invention.

In FIG. 4b, the bonded structure 10''' undergoes a trimming process using a trim tool 12, e.g., dicing blade, positioned at a corresponding angle. In embodiments, the trimming process will trim both the wafer 10a' and the carrier wafer 16, in a conventional manner. This trimming process will expose the bond interface, e.g., bonding material 14 between wafer 10a' and the carrier wafer 16.

Prior to the processes described herein, the interface would be subject to chemical attack in downstream processes. For example, the directional nature of film (e.g. oxide/nitride) deposition leaves the interface exposed. This can lead to formation of voids in the bond and cracking of the wafer due to lack of sufficient mechanical support at the wafer edge. This problem is solved by the present invention by depositing a barrier film 28 at the interface 14, as described further with regard to FIG. 4d.

Figure 4C:
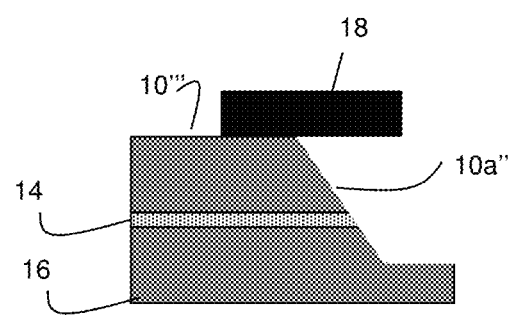
FIG. 4c shows a process of thinning the edge trimmed wafer and respective structures in accordance with aspects of the present invention.
Figure 4D:
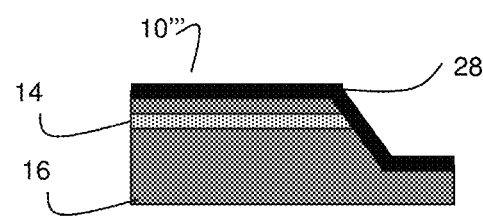
FIG. 4d shows a process of coating the edge trimmed wafer and interface between the substrate and respective structures in accordance with aspects of the present invention.

In FIG. 4c, the wafer 10a' is thinned using a grind wheel 18, for example. In FIG. 4d, after the final thickness of the wafer 10a' has been reached, a barrier film 18 is formed over the exposed surfaces of the interface 14 between the wafer 10a' and the carrier wafer 16. The barrier film 28 can also be formed over exposed portions of the wafer 10a' and the carrier wafer 16. In embodiments, the barrier film 28 can be a wet etch resistant material, e.g., oxide film or a nitride film, deposited using conventional deposition processes, e.g., chemical vapor deposition (CVD) or plasma enhanced CVD (PECVD) or atomic layer deposition (ALD). Accordingly, due to the beveled trim geometry which allows the interface to be covered during the deposition process, the interface is rendered resistant to downstream chemical attack.

The structure(s) and processes as described above are used in integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
   prior to attaching a wafer to a carrier wafer, trimming only a lower edge of the wafer at an angle to form a sloped sidewall with a smaller diameter lower portion than a non-trimmed larger diameter at an upper surface of the wafer;
   after the trimming of the edge of the wafer, bonding the smaller diameter lower portion of the wafer to the carrier wafer; and
   after the wafer is bonded to the carrier wafer at the smaller diameter lower portion, thinning the wafer starting from a straight sidewall at the larger diameter upper surface and continuing downwards towards the smaller diameter lower portion while the wafer remains attached to the carrier wafer, wherein, after the thinning, a top surface of the wafer remains a larger diameter than the smaller diameter lower portion.

2. The method of claim 1, wherein the trimming of the edge forms a bevel about the wafer at a lower surface.

3. The method of claim 1, wherein the sloped sidewall is formed from a top surface to a bottom surface of the wafer.

4. The method of claim 3, wherein the trimming results in the bottom surface having a diameter that is less than a top surface of the wafer.

5. The method of claim 4, wherein the diameter of the bottom surface is 1-10 mm less than the diameter of the upper surface.

6. The method of claim 4, wherein the sloped sidewall is at an angle from about 10° to about 80°.

7. The method of claim 3, wherein the sloped sidewall is formed from a straight sidewall to a bottom surface of the wafer.

8. The method of claim 7, wherein the thinning removes the straight sidewall and portions of the sloped sidewall.

9. The method of claim 3, wherein the sloped sidewall is formed from a top surface of the wafer to a pedestal that is formed by straight edge cut at a bottom portion of the wafer.

10. The method of claim 9, wherein the pedestal is formed to a height of about 15 to 50 µm.

11. The method of claim 1, wherein the thinning of the wafer is a grinding starting from the larger diameter upper surface to a smaller diameter lower surface, closest to the carrier wafer.

12. A method comprising:
    prior to attaching a wafer to a carrier wafer, beveling a bottom edge of the wafer resulting in a top surface having a diameter larger than a diameter of a bottom surface, wherein the beveled edge extends from a straight sidewall that extends to the top surface of the wafer;
    after the beveling, bonding the smaller diameter bottom surface of the wafer to the carrier wafer; and
    grinding the top surface of the wafer starting from the straight sidewall and to beyond an extent of the straight sidewall while it remains bonded to the carrier wafer, wherein, after the grinding, the diameter of the top surface of the wafer remains larger than the smaller diameter bottom surface.

13. The method of claim 12, wherein the beveled edge extends from the top surface to the bottom surface of the wafer after the grinding.

14. The method of claim 12, wherein the beveled edge is at an angle from about 10° to about 80°.

15. The method of claim 12, wherein the thinning removes the straight sidewall and portions of the beveled edge.

16. The method of claim 12, wherein the beveled edge is formed from the top surface of the wafer to a pedestal that is formed by the straight sidewall.

17. The method of claim 1, wherein:
    the top surface of the wafer is thinned,
    the top surface that is thinned will always be supported by the sloped sidewall from an underside during the thinning of the wafer,
    the bonding is performed after the edge trimming such that a thinning of a bottom carrier wafer and any trim in an edge of the bottom carrier wafer is avoided, and
    the edge trimming is independent of any tolerances of an edge trimming tool.

\* \* \* \* \*